(12) United States Patent
Yang et al.

(10) Patent No.: US 9,899,554 B2
(45) Date of Patent: Feb. 20, 2018

(54) METHOD OF INSTALLING A STRAIN RELIEF APPARATUS TO A SOLAR CELL

(71) Applicant: SolarCity Corporation, San Mateo, CA (US)

(72) Inventors: Bobby Yang, San Mateo, CA (US); Jiunn Benjamin Heng, San Mateo, CA (US); Zheng Xu, San Mateo, CA (US)

(73) Assignee: SolarCity Corporation, San Mateo, CA (US)

( * ) Notice: Subject to any disclaimer, the term of this patent is extended or adjusted under 35 U.S.C. 154(b) by 119 days.

(21) Appl. No.: 14/985,383

(22) Filed: Dec. 30, 2015

(65) Prior Publication Data

US 2017/0170337 A1    Jun. 15, 2017

Related U.S. Application Data

(60) Provisional application No. 62/267,281, filed on Dec. 14, 2015.

(51) Int. Cl.
| | |
|---|---|
| *H01L 31/05* | (2014.01) |
| *B23K 1/00* | (2006.01) |
| *H01L 31/02* | (2006.01) |
| *H01L 31/0475* | (2014.01) |
| *B23K 1/012* | (2006.01) |
| *B23K 3/08* | (2006.01) |
| *B65G 47/90* | (2006.01) |
| *H01L 21/66* | (2006.01) |
| *H01L 31/18* | (2006.01) |

(52) U.S. Cl.
CPC ........ *H01L 31/0508* (2013.01); *B23K 1/0016* (2013.01); *B23K 1/012* (2013.01); *B23K 3/08* (2013.01); *B65G 47/90* (2013.01); *H01L 22/12* (2013.01); *H01L 31/0201* (2013.01); *H01L 31/0475* (2014.12); *H01L 31/0504* (2013.01); *H01L 31/18* (2013.01)

(58) Field of Classification Search
None
See application file for complete search history.

(56) References Cited

U.S. PATENT DOCUMENTS 4,301,322 A * 11/1981 Amick ................ H01L 31/0508
                                                                    136/244
5,411,897 A    5/1995 Harvey et al.
(Continued)

FOREIGN PATENT DOCUMENTS

| CN | 103692097 A | 4/2014 |
|---|---|---|
| EP | 2295184 B1 | 3/2011 |

OTHER PUBLICATIONS

Rockwell Automation, "Automation control for photovoltaic stringer equipment", brochure, Aug. 2009, p. 1-4.*

(Continued)

*Primary Examiner* — Devang R Patel
(74) *Attorney, Agent, or Firm* — Kilpatrick Townsend & Stockton LLP

(57) ABSTRACT

Methods are disclosed for assembling PV modules using connectors that have strain relief elements. Strings can be inspected individually and dimensional information can be obtained to layup the strings into a PV module in a specific manner. Portions of the strings can be soldered using elevators to lift connectors into place, and then applying heat to both sides of the connector.

14 Claims, 11 Drawing Sheets

(56) References Cited

U.S. PATENT DOCUMENTS

| | | | | |
|---|---|---|---|---|
| 6,841,728 | B2* | 1/2005 | Jones | H01L 31/188 |
| | | | | 136/244 |
| 7,754,962 | B2* | 7/2010 | Okamoto | H01L 31/0747 |
| | | | | 136/244 |
| 8,322,300 | B2 | 12/2012 | Pavani et al. | |
| 8,636,198 | B1 | 1/2014 | Linderman et al. | |
| 8,651,354 | B2 | 2/2014 | Luechinger et al. | |
| 8,662,008 | B2 | 3/2014 | Abas et al. | |
| 8,759,663 | B2 | 6/2014 | Okamoto et al. | |
| 2008/0223429 | A1* | 9/2008 | Everett | H01L 24/80 |
| | | | | 136/244 |
| 2009/0032087 | A1* | 2/2009 | Kalejs | H01L 31/0516 |
| | | | | 136/246 |
| 2009/0139557 | A1* | 6/2009 | Rose | H01L 31/18 |
| | | | | 136/244 |
| 2013/0048047 | A1* | 2/2013 | Fujii | H01L 31/0504 |
| | | | | 136/244 |
| 2013/0206204 | A1* | 8/2013 | Yoshida | H01L 31/0504 |
| | | | | 136/244 |
| 2013/0272833 | A1* | 10/2013 | Duncan | H01L 31/188 |
| | | | | 414/737 |
| 2014/0060611 | A1 | 3/2014 | Koch et al. | |
| 2015/0090314 | A1* | 4/2015 | Yang | H01L 31/022433 |
| | | | | 136/244 |
| 2015/0270410 | A1* | 9/2015 | Heng | H01L 31/0504 |
| | | | | 136/251 |
| 2015/0349175 | A1* | 12/2015 | Morad | H01L 31/0508 |
| | | | | 136/251 |

OTHER PUBLICATIONS

Antwerp, "Solar Module Assembly: Automation for Cell String Interconnection Soldering," North American Clean Energy, May 19, 2012, retrieved from the internet at http://www.nacleanenergy.com/articles/13559/solar-module-assembly-automation-for-cell-string-interconnection-soldering, North American Clean Energy, 3 pages.

Steinkötter, "Reinventing Stringers," PV Magazine, Jun. 2011, retrieved from the internet at http://www.pv-magazine.com/archive/articles/beitrag/reinventing-stringers-__100003049/329/%20-%20axzz3vvHNK4hl, 7 pages.

Unpublished U.S. Appl. No. 14/985,376, filed Dec. 30, 2015, by Lilja Magnusdottir et al. (41 pages).

\* cited by examiner

METHOD OF INSTALLING A STRAIN RELIEF APPARATUS TO A SOLAR CELL

CROSS-REFERENCE TO RELATED APPLICATIONS

This application claims the benefit of Provisional Application No. 62/267,281, filed on Dec. 14, 2015, the entirety of which is incorporated by reference.

DEFINITIONS

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A solar cell may be divided into a number of strips. A strip may have any shape and any size. The width and length of a strip may be the same or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a string.

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND

Photovoltaic (PV) technology has made great strides in recent years through breakthroughs in efficiency for PV modules. Such improvements, in combination with decreases in manufacturing cost for PV modules is making solar a more viable energy source. Cost per watt is perhaps the most determinative factor when deciding to implement a solar power installation.

Solar cells can be constructed from a base structure of silicon and assembled into a PV module having a basic laminate structure. To reduce costs and for other advantages, recent improvement in using connection materials such as copper, to form a connection grid for a solar cell have improved efficiency and lowered overall cost per watt, thus improving the viability of solar energy.

However, use of materials such as copper can present issues due to disparate coefficients of expansion that exist with respect to silicon based solar cells. Generally, copper expands much more than silicon for a given increase in temperature. Such effects can be exacerbated when portions of a PV module are shaded. Over time, cyclical thermal loading can cause portions of the PV module to break.

One solution proposed for this is disclosed at co-assigned U.S. patent application Ser. No. 14/985,376, entitled "STRAIN RELIEF APPARATUS FOR SOLAR MODULES," filed on Dec. 30, 2015, which is incorporated by reference herein. The solution involves the use of strain relief connectors that absorb strain caused by thermal expansion and contraction. The form of the strain relief connectors can be teeth-like connectors that extend non-linearly from relatively large connector buses. Handling and manufacturing PV modules using such connectors is particularly challenging due to the fragile nature of the strain relief connectors. Accordingly, specific assembly methods to take advantage of such connectors are needed.

BRIEF SUMMARY

As noted above, use of materials such as copper within a PV module can present issues due to disparate coefficients of expansion with respect to silicon. This is particularly true of connectors that have large mass, which is required for transmission of current but as a result can have a relatively large thermal expansion effect to the PV module as a whole. Such connectors are used to connect strings in series and/or parallel depending on the electrical configuration of a particular PV module. Often, the result of thermal expansion of these connectors is fracturing of epoxied connections between overlapping strips that make up a string. To overcome these issues, relatively low mass strain relief elements can connect to large mass connector portions.

Systems are disclosed herein for manufacturing PV modules using such connectors. This can be particularly challenging due to the extremely low mass of the strain relief elements. One step to address this issue is providing a method for inspecting and laying down strings for assembly in to a PV module. Due to tolerance stacks of many strips, the dimensions of strings can vary. For purposes of string layup, it is important to know the dimensions of strings so that strings can be laid out to align with other strings. Accordingly, a vision system can be configured to scan strings to obtain dimensional (e.g., length and width) information, as well as locations of various busbars that can be present on the strings for connection to the strain relief connectors. This dimensional information can be used to precisely place the strings at required locations.

After the strings are properly positioned, the connectors can be placed on the strings for soldering. Soldering can be particularly challenging for bottom facing edge locations of the strings. In such cases, the connectors can be picked and placed onto elevators, which are controlled to lift the strain relief elements against the strings. The strain relief elements can be secured from both sides of the strings, and then hot air can be directed at the strain relief elements to cause solder paste to reflow and solder to the strings.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

Figure 1A:
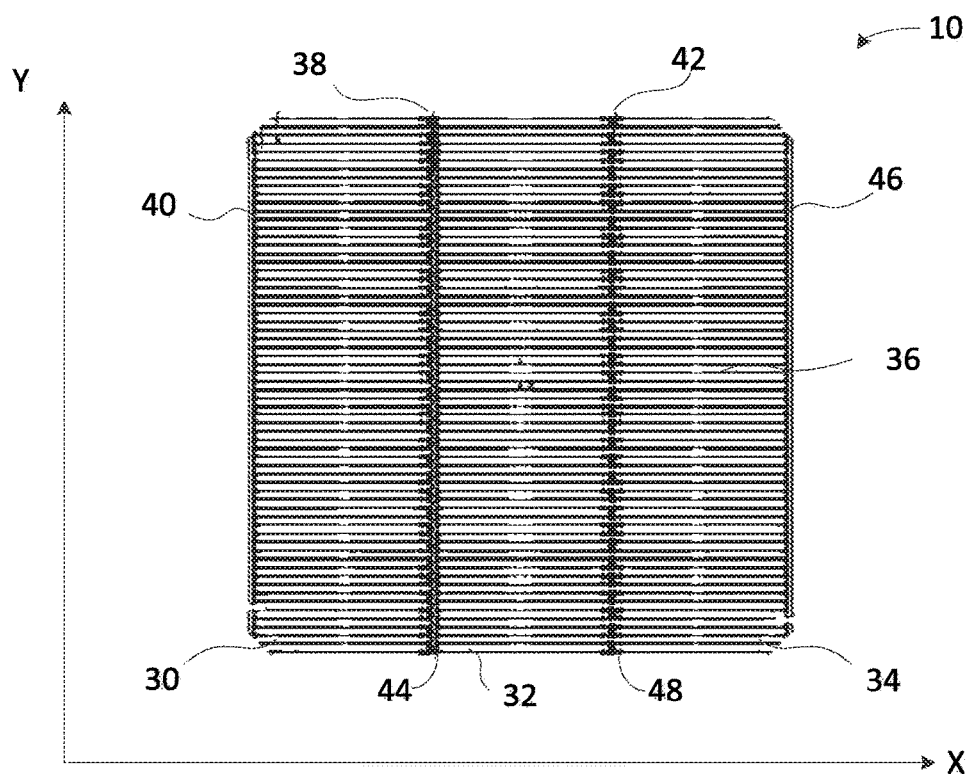
FIG. 1A shows a top views of a solar cell, according to some embodiments of the invention.

FIG. 1A shows solar cell 10 including three photovoltaic strips 30, 32, and 34. Solar cell 10 can have an electroplated copper electrode that exhibits low contact resistance. Each strip can include a number of substantially parallel finger lines, such as finger lines 36, arranged in the X direction. These finger lines can collect the carriers generated by the photovoltaic structure and allow them to move toward a busbar. The busbar can be any electrically conductive element such as a metallic strip, often wider than a finger line, arranged in the Y direction. The busbar then can aggregate the current collected by the finger lines. Each strip can include two busbars, one on each surface, positioned on opposite edges. For example, strip 30 can have busbar 38 on the top surface, and busbar 40 on the bottom surface. Similarly, strip 32 can have busbars 42 and 44 on the top and bottom surfaces, respectively, and strip 34 can have busbars 46 and 48 on the top and bottom surfaces, respectively.

Some conventional solar panels include a single string of serially connected un-cleaved photovoltaic structures. As described in U.S. patent application Ser. No. 14/563,867, which is incorporated by reference herein, it can be more desirable to have multiple (such as 3) strings, each string including cascaded strips, and connect these strings in parallel. Such a multiple-parallel-string panel configuration provides the same output voltage with a reduced internal resistance.

Figure 1B:
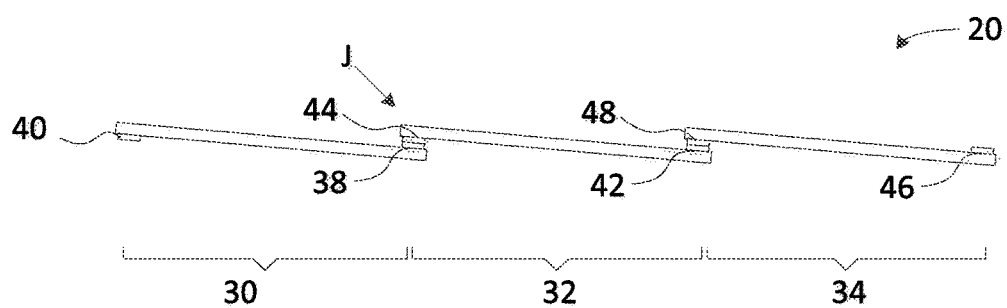
FIG. 1B shows a side view of a string constructed from strips, according to some embodiments of the invention.

FIG. 1B shows a cascaded arrangement of three strips connected in series and assembled as string 20. In this example, three strips 30, 32, and 34 can be cleaved from solar cell 10 of FIG. 1A and arranged in a cascaded manner, such that the positive-side busbar of one strip overlaps and is electrically coupled to the negative-side busbar of the neighboring strip. While three strips are depicted for string 20, more or less strips can make up a string. In addition, string 20 can be coupled with additional strings (eleven of strings 20 for example) to produce a longer string, and six of these longer strings can be connected to form a PV module.

Often, assembly of a string is performed by adhering each busbar using a conductive adhesive, which is an effective method to assemble an efficient PV modules. However, in some environments, PV modules exhibit great strain due to effects of heating, and in particular effects of heating components, such as copper busbars, that have a disparate coefficient of expansion. This can be exacerbated by non-uniform heating of the PV modules, often caused by partial sun shading of the PV modules. These heating effects can result in cyclical loading onto joints J between busbars, resulting in cracking and eventual failure of the joint. Connectors as disclosed herein can help alleviate these effects.

Figure 2:
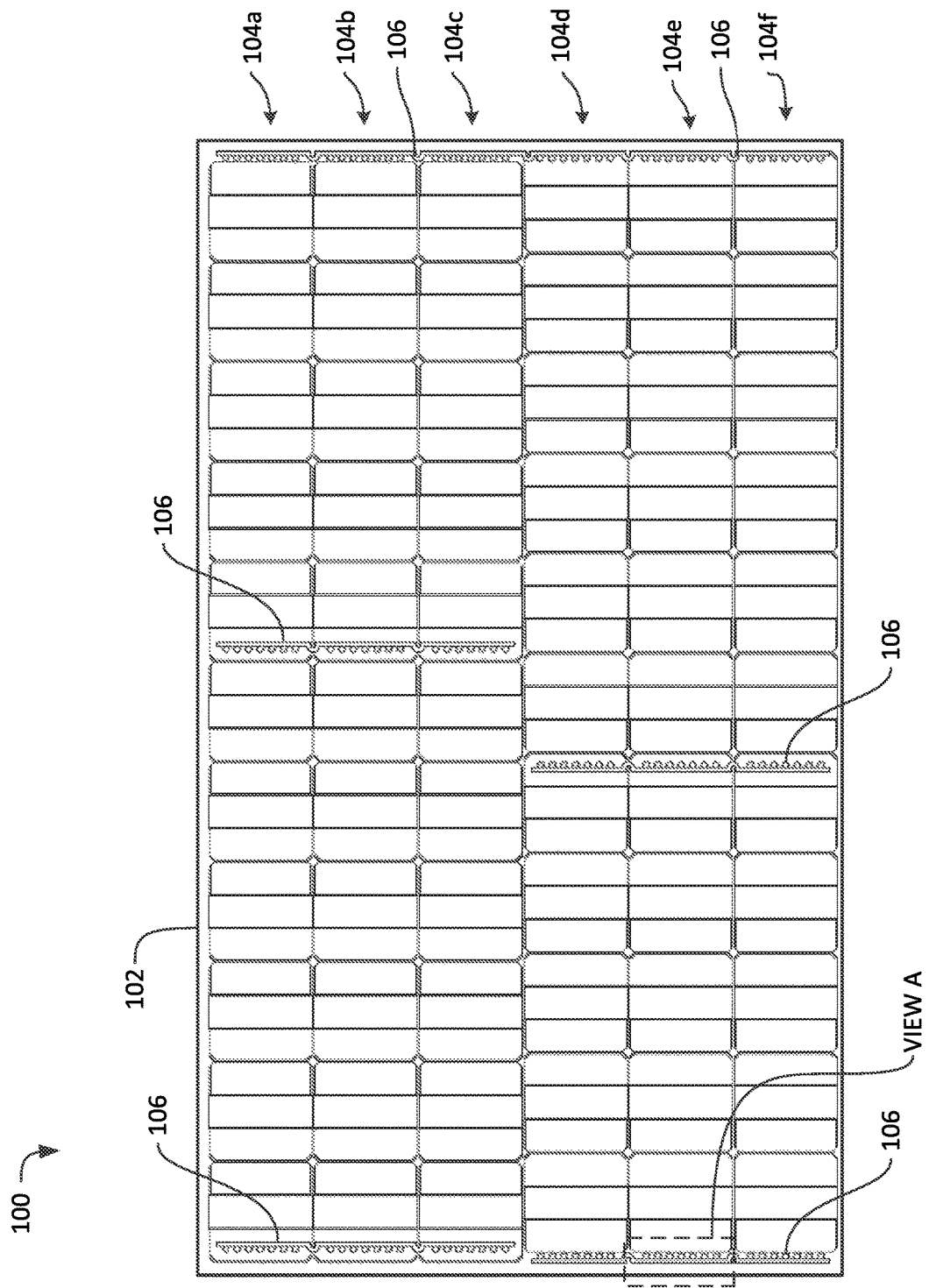
FIG. 2 shows a top view of a PV module, according to some embodiments of the invention.

FIG. 2 shows a top view of PV module 100. PV module 100 can have a laminated structure that includes one or more substrates 102, such as a glass sheet and/or back sheet. PV module includes strings 104a-f, each of which can be assembled from eleven of strings 20 of FIG. 1B for example.

Connection members 106, also referred to as "combs" or "comb connectors" herein, are connected to busbars of strings 104a-f by way of strain relief connectors, which are described in further detail below. Connection members 106 can be formed from a metal foil, such as copper, by way of stamping or cutting for example. Connection to the busbars of the strings 104a-f, can be made by soldering, welding, or bonding strain relief connectors 106 to busbars of strings 104.

Figure 3:
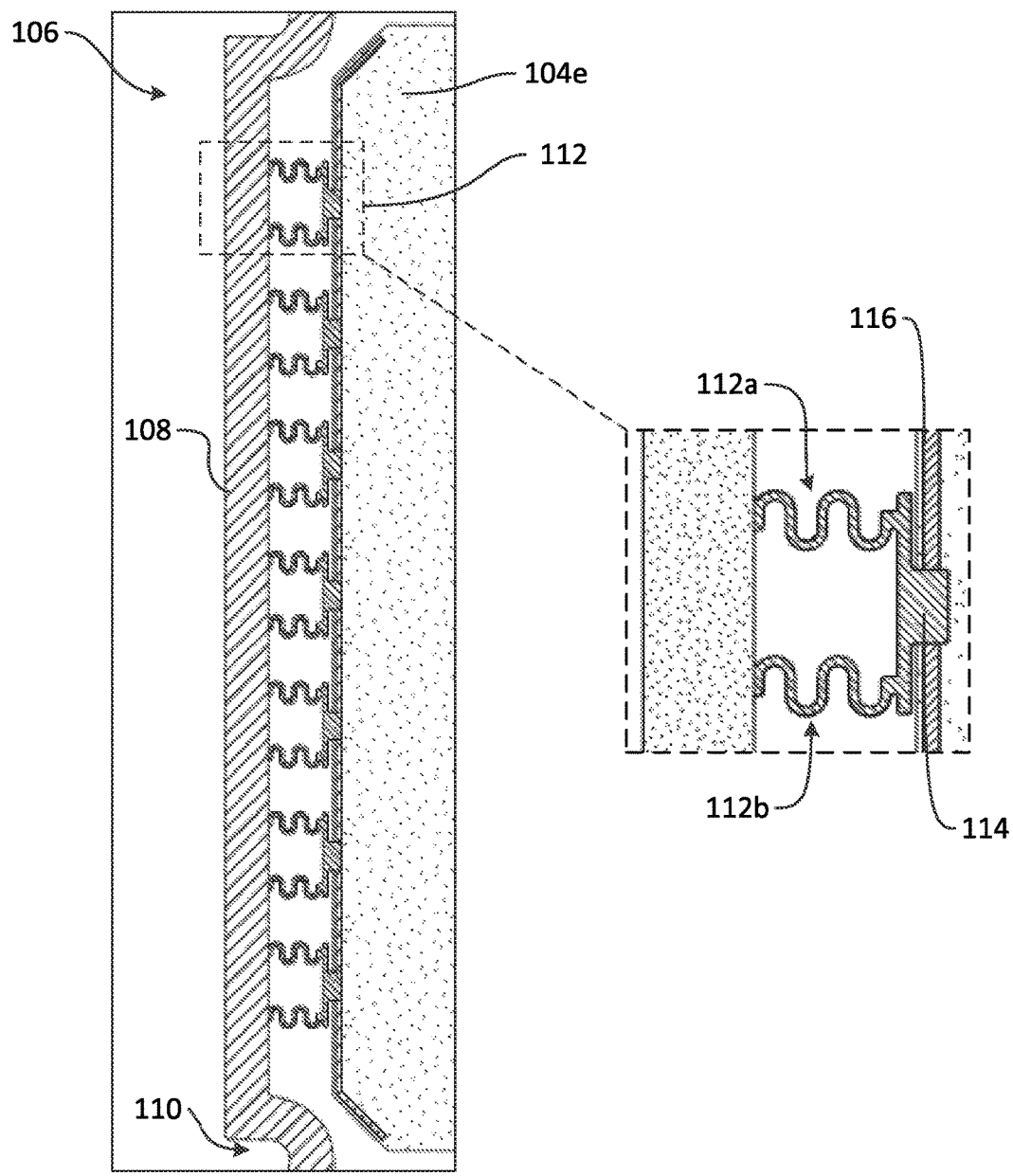
FIG. 3 shows a top view of comb connector, according to some embodiments of the invention.

FIG. 3 shows view A of FIG. 2, which is a top view of a portion of connection member 106, connected to string 104e. Connection member 106 can be stamped, cut, or otherwise formed from any suitable conducting material, such as copper foil. Copper is a highly conductive and relatively low cost connector material. However, other materials such as silver can be used. Connection member 106 can be coated at portions with insulation to prevent shorting. Connection member can also be coated at portions with solder material for reflow soldering to other conductors.

Connection member 106 includes connection bus 108, which is elongated for connection to one or more strings. Connection member 106 can be configured to connect three strings in parallel. The smallest cross-sectional area of connection bus 108 is in the vertical direction, which is dimensioned to be sufficient enough to carry a predicted current load. Connection bus 108 can include bus curves 110 located between strings. Bus curves 110 can help contribute to strain relief for strain between strings. Bus curves 110 are U-shaped, however other shapes, such as S-shapes can be used.

Strain relief connectors 112, also referred to as "teeth" herein, extend laterally from connection bus 108. Each of strain relief connectors 112 extends in a non-linear manner. For example, each of strain relief connectors 112 can have curvilinear geometry that can extend laterally in a manner roughly resembling a sine wave. Here, each of strain relief connectors 112 can include a pair of sub-connectors 112a/112b. Each of sub-connectors 112a/112b curves from connection bus 108 upwardly to form a U-shaped curve and repeats this pattern to form four curves. In this example, each of strain relief connectors 112 is identically formed, however, this is not required.

The pattern and number of curves for each of strain relief connectors 112 can alternate and change. For example, twenty-one of strain relief connectors 112 can be used, with seven of strain relief connectors 112 assigned per string. However, more or less of strain relief connectors 112 can be used. Generally, the total cross-sectional area of the strain relief connectors 112 for one string combined should be at least equal to the cross-sectional area of connection bus 108.

Each pair of sub-connectors 112a/112b can terminate at solder pad 114 to form an electrical connection with string 104 at busbar 116. Solder pad 114 can have a rectangular shape and can hold a predetermined amount of solder material for reflow soldering to string 104. Pairing sub-connectors as shown aids in manufacturability, because every strain relief connector 112 effectively counts as two separate connectors with respect to strain, but only requires a single solder connection. However, non-paired sub-connectors can be used as well.

Strain relief connectors 112 are configured to absorb movement of the connection bus 108, such that motion transferred to connected strings is significantly lessened. Connection bus 108 has relatively large mass for purposes of current capacity. This mass can be detrimental however, when connection bus 108 flexes due to thermal expansion and contraction. String 104 can be interconnected by epoxy joints that do not have enough capacity to tolerate strain caused by connection bus movement. Strain relief connectors 112 can absorb a great deal of predicted strain caused by connection bus movement, and thus provide strain relief for string 104.

Figure 4:
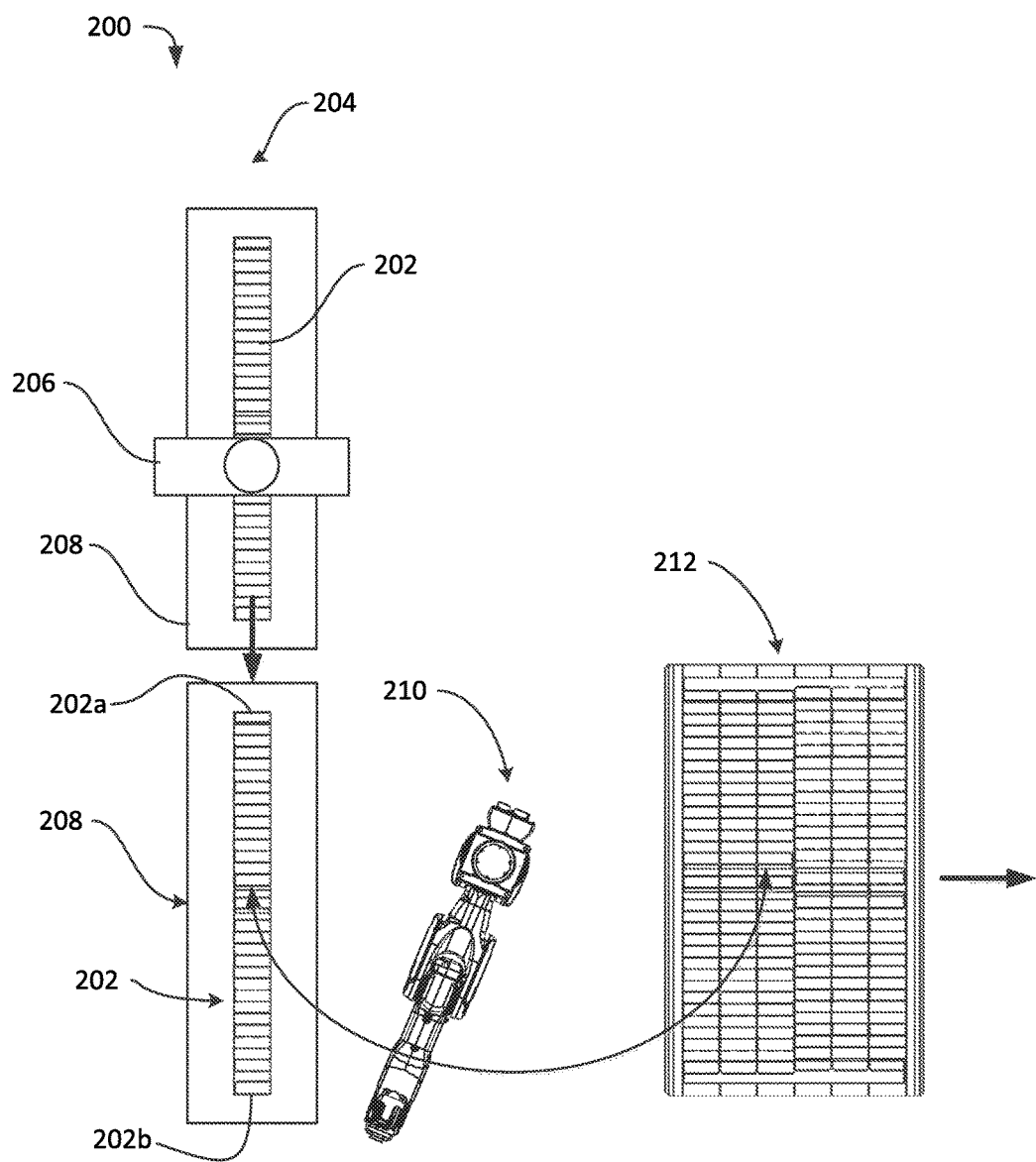
FIG. 4 shows a floor diagram of a string inspection and layup system, according to some embodiments of the invention.

FIG. 4 shows string layup system 200 for assembly of string 202 into a PV module, such as PV module 100 of FIG. 2. String 202 can take the form, for example of string 20 as shown at FIG. 1B. While string 20 at FIG. 1B is shown only having 3 strips, string 202 can be assembled from several of strings 20 (11 of strings 20 for example). Accordingly, string 202 can be assembled from 33 strips for example. String 202 can be received from an automated assembly station configured for bonding several of string 20 of FIG. 1B into string 202.

Inspection module 204 receives one or more of strings 202 for performing inspection and measuring processes. Prior or during to receiving strings 202, string 202 can be manipulated to place a negative or positive terminal of string 202 in a certain orientation. Inspection module 204 can receive string 202 by way of one or more of, for example, a conveyor shuttle, gantry based overhead pick and place system, or multi-axis robot.

Inspection module 204 includes vision system 206 for performing camera-based inspection and measuring processes. Shuttle 208 can be back-lit to help enable visualization of string 202, or vision system 206 can include an LED lamp that illuminates string 202 so vision system 206 can inspect string 202 for cracks or other defects. Strings that do not meet inspection criteria will be rejected for assembly into a PV module.

Vision system 206 can also scan string 202 to obtain dimensional information of string 202. As described with reference to FIGS. 1A and 1B, string 202 can be assembled by performing a cleaving process and bonding strips together in a cascade fashion. Accordingly, string 202 can be assembled from 33 strips for example. Due to tolerance stacks of many parts, the dimensions of strings produced in this manner can vary, and hence every string assembled in this manner will not be identical. For purposes of layup, it is important to know the dimensions of string 202 so that string 202 can be laid out to align with other strings.

Accordingly, vision system 206, or another vision system, can be configured to scan string 202 to obtain dimensional (e.g., length and width) information, as well as locations of various busbars that can be present on string 202 for connection of the strain relief connectors disclosed herein. This information can be stored and shared with various other sub-systems of inspection module 204, and other system disclosed herein related to placing and soldering connectors.

A multi-axis robot 210 can obtain and use the dimensional information of string 202 for laying string 202 on shuttle 212. Multi-axis robot 210 can include provisions, such as suction cups to pick and place string 202 on shuttle 212. Shuttle 212 can be configured, for example, to hold 6 strings for eventual assembly into a complete PV module.

String 202 can have two asymmetric edges 202a/202b. Edge 202a can include a positive bus terminal and face a first direction. Edge 202b can include a negative bus terminal and face a second direction that is opposite the first direction. Multi-axis robot 210 can be configured to place string 202 on shuttle 212 to match desired specifications, for example, by aligning three strings, according to string 202, in the same orientation that aligns all positive busbars, and another three strings in an opposite configuration that aligns all negative busbars with the positive busbars of the first three strings.

Multi-axis robot 210 can be configured to align each set of strings such that edge 202a of each string is within +/−0.5 mm. After the required amount of strings have been arranged by multi-axis robot 210 according to required specifications, shuttle 212 can be automatically conveyed, by a conveyor system that shuttle 212 is arranged on for example, to a busing system for soldering of one or more connectors.

Figure 5:
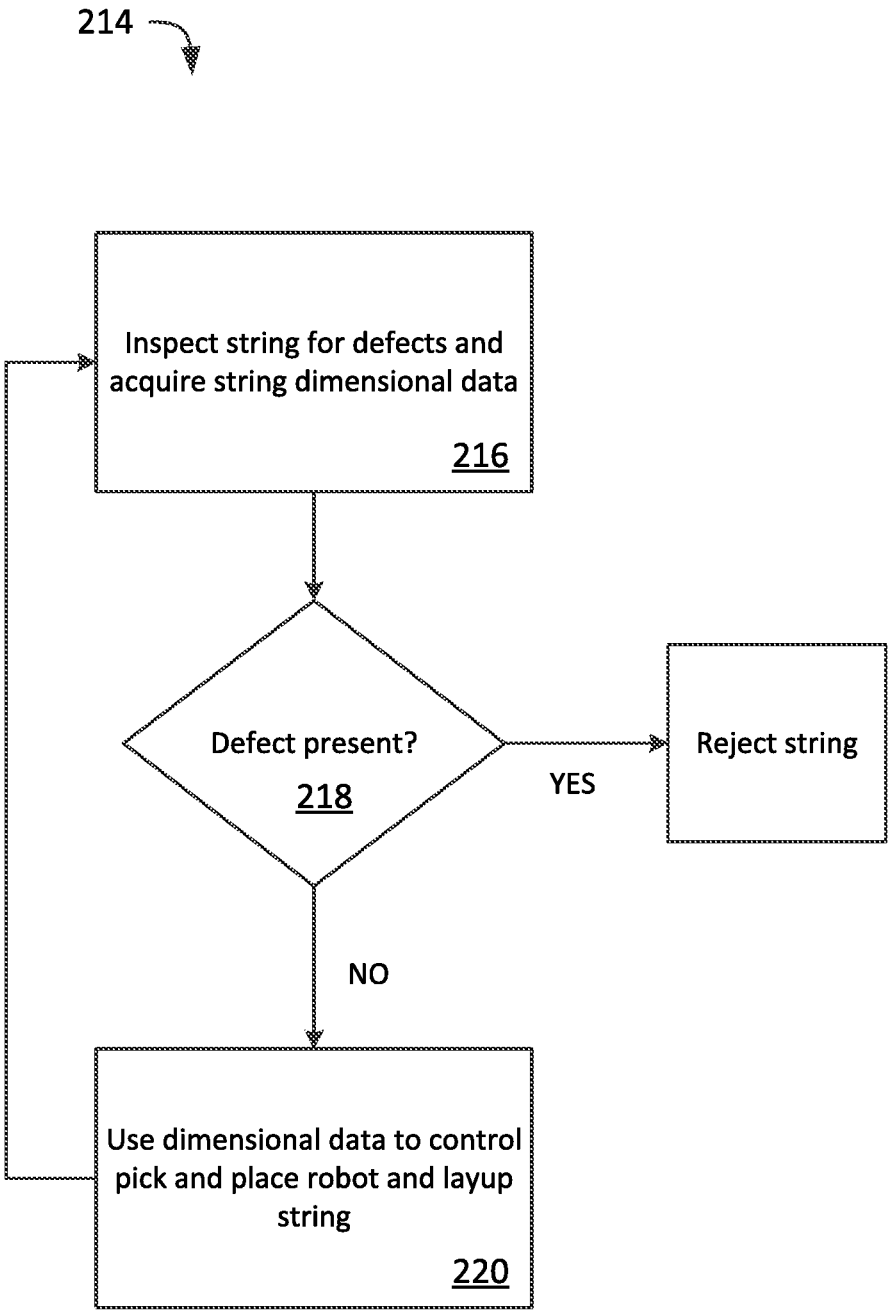
FIG. 5 shows a flow chart of a method for inspecting and placing strings, according to some embodiments of the invention.

FIG. 5 illustrates method 214 for laying out strings for assembly into a PV module. Method 214 can be performed using a computer controlled system utilizing a vision system and pick-and-place robot, such as system 200 illustrated at FIG. 4.

At operation 216, a string is inspected for defects using a computer controlled vision system. The string can take the form, for example of string 20 as shown at FIG. 1B. While string at FIG. 1B is shown only having 3 strips, the string used for method 214 can be assembled from several of strings 20 (11 of strings 20 for example). The string can be received from an automated assembly station configured for bonding several smaller strings.

The vision system can inspect the string for cracks or other defects. In addition, the vision system can acquire dimensional information of the string, such as length and width, and location of positive and negative busbars on the string. This dimensional information can be saved for later use. At operation 218, the string is routed away appropriately if it fails inspection.

At operation 220, the string can be picked up by a multi-axis robot and placed on a shuttle. The shuttle can be configured for holding a certain amount of strings for assembly into a PV module. The multi-axis robot can access the dimensional information obtained by the vision system and use it to precisely place the string onto the shuttle in a specific location. The dimensional information can related to position of one or more edges of each string. Due to assembly issues, not every string is precisely identical, thus dimensional information can be helpful for aligning similar but non-identical strings.

For example, the multi-axis robot can place each string according to aligning outermost edges or edges of busbars of each string with one another, within a predetermined tolerance, and with respect to an edge of a substrate or shuttle. In another example, where one string is longer or shorter than other strings and hence has busbars that do not centrally align with busbars the other strings, the longer or shorter string can be placed so its busbars align according to a best possible fit within a predetermined tolerance with the other strings, or set aside to be used with more compatible companion strings. The location can be according to a layup specification for the PV module. For example, the PV module can be specified to have a set of three strings with negative terminals aligned to positive terminals of another set of three strings.

Figure 6:
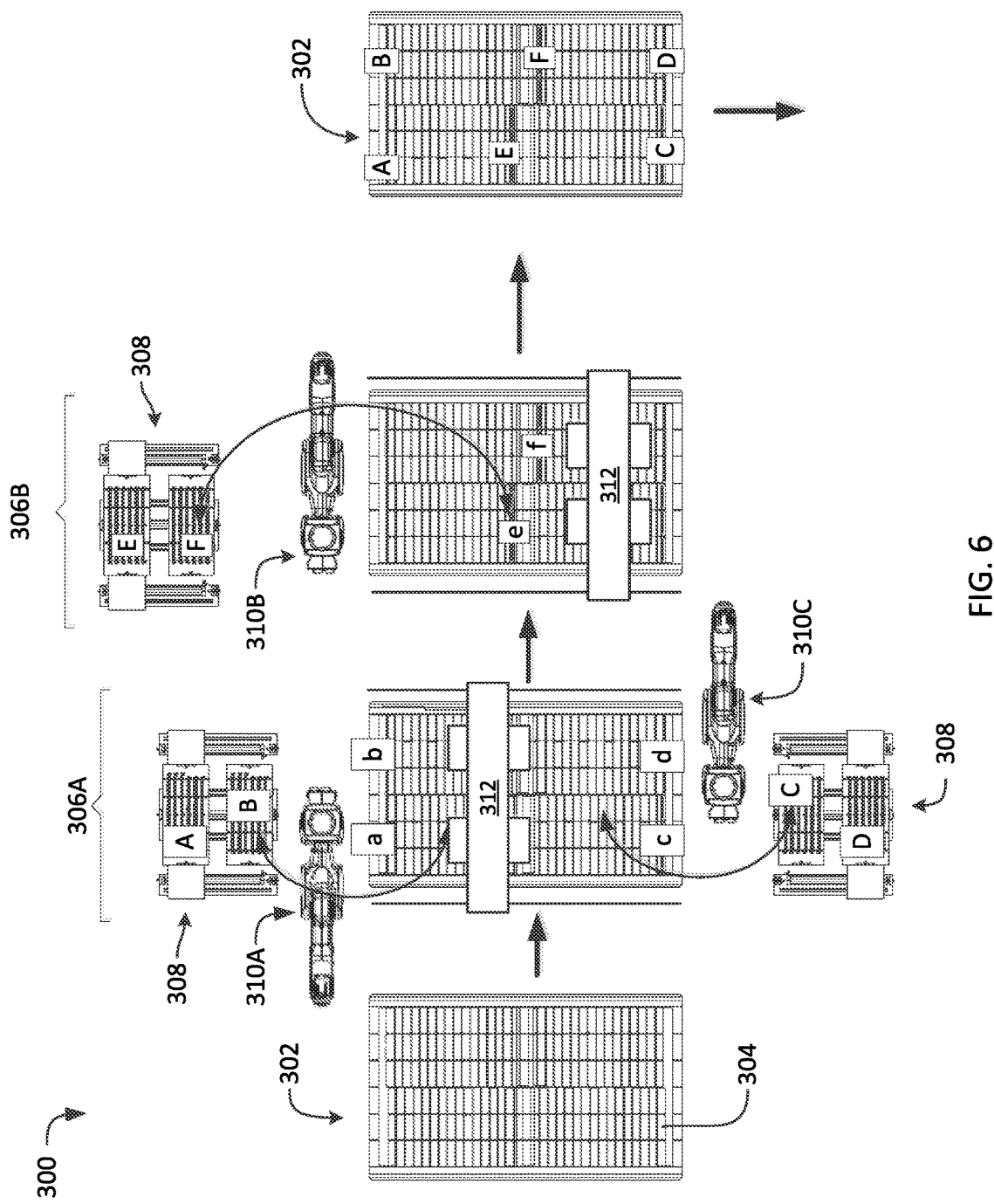
FIG. 6 shows a floor diagram of a string connector placement and soldering system, according to some embodiments of the invention.

FIG. 6 shows PV module busing system 300 for soldering one or more connectors to one or more strings. Shuttle 302 includes strings 304, which have been arranged on shuttle 302 in a predetermined manner. Shuttle 302 can be received, for example, from system 200 of FIG. 4 after a layup procedure has been performed. System 300 can include one or more busing modules 306A/306B. Each of busing modules 306A/306B can include one or more comb connector stations 308 for providing comb connectors, such as connector 106 of FIG. 3, which can be used to solder to strings 304. Shuttle 302 can be transferable to each of busing module 306A/306B by a computer controlled conveyance system, such as a conveyor track, on which shuttle 302 is disposed upon.

Each of busing modules 306A/306B includes one or more multi-axis robots 310A/B/C. Each of multi-axis robots 310A/B/C is configured to pick the comb connectors from one or more of comb connector stations 308 and place comb connectors at specific locations on strings 304. Comb connector stations 308 can include computer controlled features for application of soldering flux to the comb connectors, in preparation for a soldering procedure.

Each of multi-axis robots 310A/B/C can include provisions, such as suction cups to pick up and release the comb connectors. In some embodiments, 6 different comb connectors can be placed on strings 304 for soldering to busbar locations of strings 304. Multi-axis robot 310A can be configured to place comb connectors A and B at edge locations a and b, which can be locations of busbars of strings 304. Multi-axis robot 310B can be configured to place comb connectors C and D at edge locations c and d, which can be locations of busbars of strings 304. Multi-axis robot 310C can be configured to place comb connectors E and F at central locations e and f, which can be locations of busbars of strings 304.

Each of multi-axis robots 310A/B/C can include an integrated vision system, or be coordinated with a separate vision system, to help coordinate picking and placing comb connectors. Prior to placing comb connectors, but after picking comb connectors from stations 308, the vision system can be used to perform an inspection for each comb. For example, the vision system can be used to measure distances from one edge of electrode to another and ensure the distance is within a specified tolerance, such as +/−0.15 mm. A rejected electrode can be placed aside or a signal can be sent to another system indicating a rejection.

For comb connectors that pass inspection, multi-axis robots 310A/B/C can place the inspected comb connector on a predetermined location, such as a-f as shown, which can be locations of busbars of strings 304. The vision system can then be used to determine whether the comb connector has been placed in the correct location within an acceptable tolerance. If the comb connector is not placed in the correct location, then the misplaced comb connector can be picked up again and re-inspected before attempting to place the comb connector in the correct position.

Soldering of the comb connectors can be performed by soldering systems 312. Soldering systems 312 can be gantry mounted for translation in the X, Y, and Z directions. One of soldering systems 312 can be dedicated for each location A-F, or one or multiple of soldering stations 312 can translated between locations. There can be two types of soldering operations performed based on the location of the comb connector and configuration of the busbar to which the comb connector will be soldered to. For example, locations B, C, E, and F, can be top-soldered locations, wherein soldering takes place on an upward facing location of strings 304, and locations A and D can be bottom-soldered locations, wherein soldering takes place on downward facing locations of strings 304. After the soldering operations are complete, shuttle 302 can be moved to a new PV module assembly procedure.

Figure 7A:
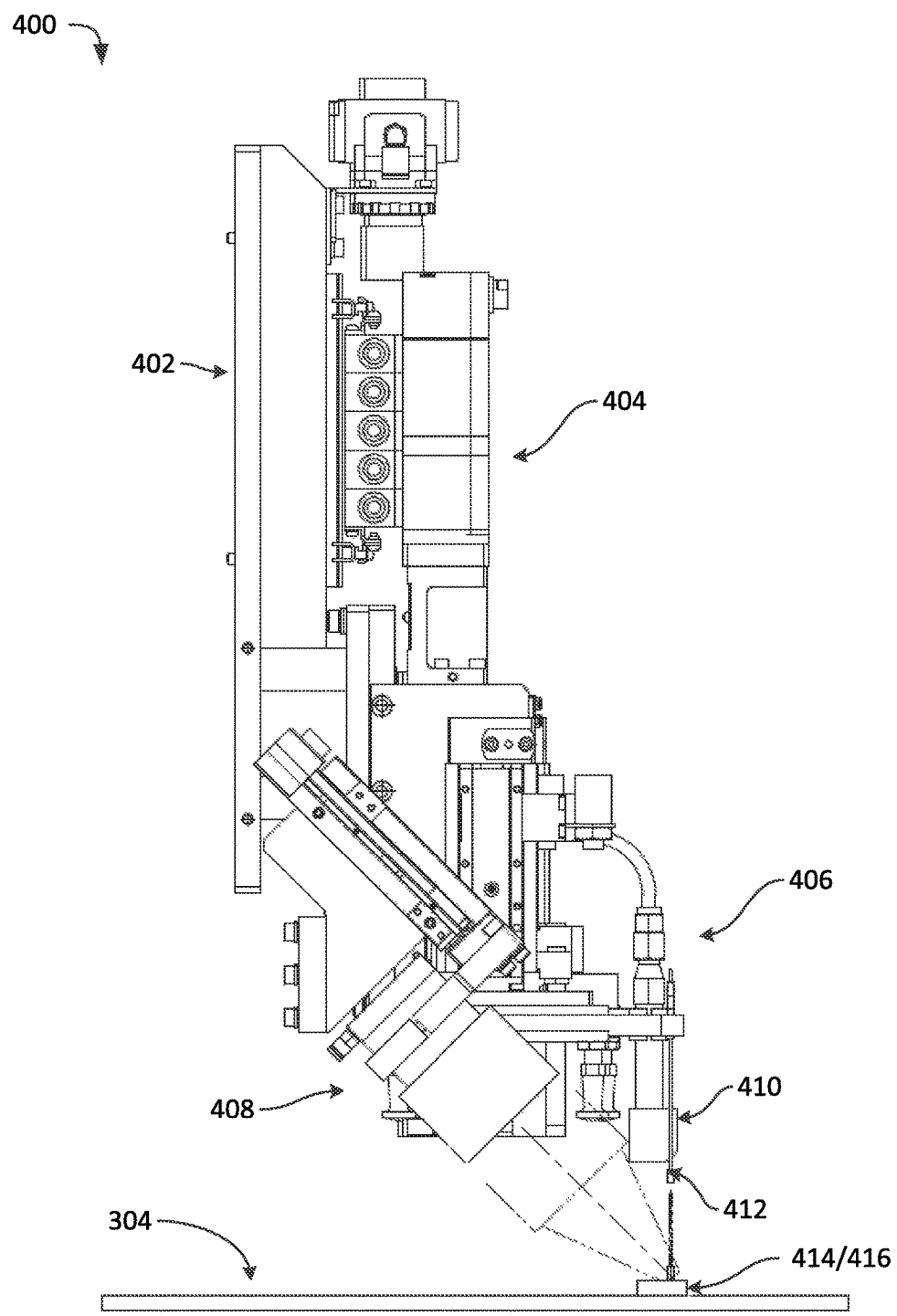
FIGS. 7A-7C show views of a soldering system, according to some embodiments of the invention.
Figure 7B:
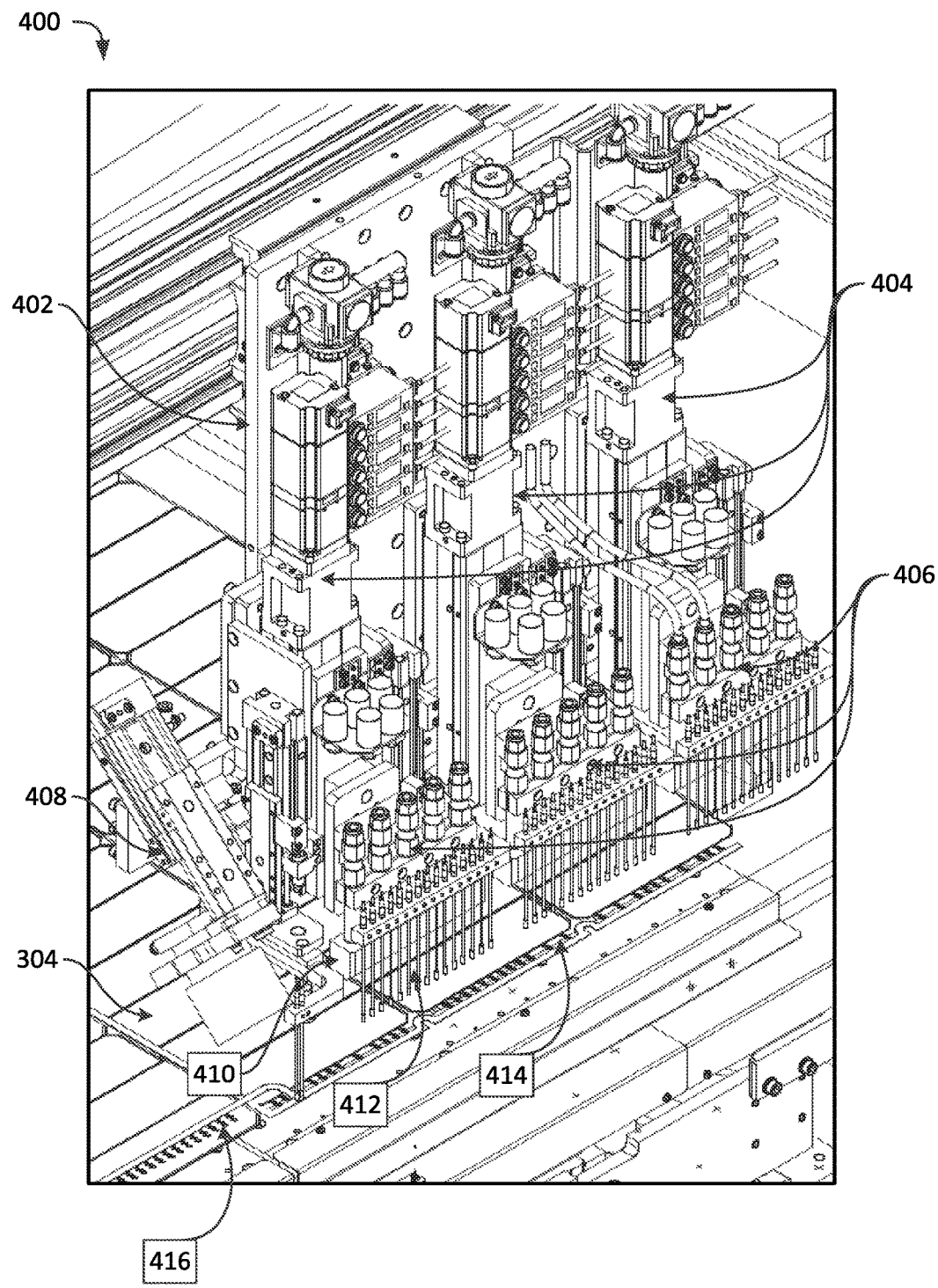

An example of a soldering station useable for system 300 is depicted at FIGS. 7A and 7B, which depict side and perspective views of soldering station 400. Soldering station 400 includes gantry mount 402 for movable mounting of soldering station 400 to a gantry. Motive systems 404 can include controllers, motors, vision systems, and power systems for providing movement and guidance to soldering station 400. Heater assemblies 404 are mounted to soldering system 400 for vertical translation. A halogen heater 408 can be provided for preheating portions of strings 304 in preparation for soldering. Provisions, such as heaters, can also be provided underneath strings 304 as well.

Heater assemblies 404 include heater blocks 410, which can be manifolds having exits for directing hot air at a certain location. Heater assemblies 404 also include pins 412, which are configured to hold comb connectors 414 during a soldering procedure. Pins 412 are moved with the heater assemblies 404 to restrain portions, such as strain relief connectors or teeth 416, of comb connectors 414 to string 304. The number of pins 412 used can correspond to the number of teeth 416 extending laterally from comb connectors 414.

In use, heater assemblies 404 can be moved downward, as shown at FIG. 7A, to contact pins 412 to teeth 416 and perform a top-soldering process. Translation of heater assemblies 404 can be assisted by an integrated vision system or by a separate vision system. Heater blocks 410 will translate downward with heater assemblies 404 to be placed in close proximity with teeth 416. Heater blocks 410 can be controlled to emit hot air at teeth 416 at a predetermined temperature for a predetermined time to reflow solder paste located on teeth 416, and accordingly solder comb connector 414 to string 304. Complete metallurgical bonding of teeth 416 to string 304 can be completed without string 304 surface exceeding 210° C. during soldering. After soldering is complete, pins 412 can be withdrawn away from teeth 416.

Figure 7C:
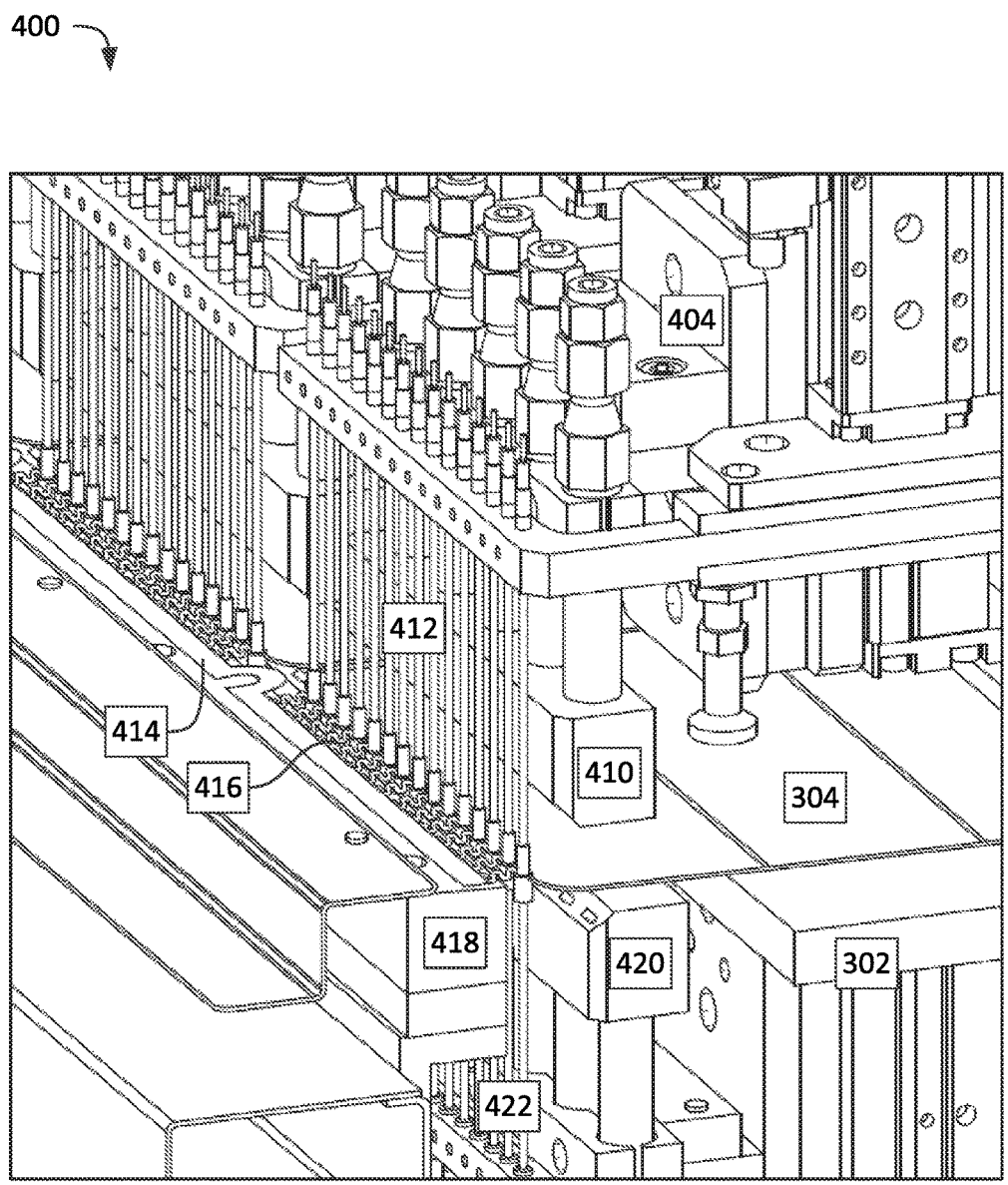

FIG. 7C shows an arrangement of soldering system 400 used to perform soldering procedures at the floor facing side of string 304, generally at a floor facing busbars located at an edge of strings 304. Here, the edge portion of strings 304 is arranged to extend in cantilever from shuttle 302 so that the busbar of string 304 is made accessible from underneath. One of multi-axis robots 310A/B/C of FIG. 6 can pick and place comb connector 414 onto elevator 418, such that teeth 416 extend freely from elevator 418 in cantilever. The robot can continue to hold the comb connector 414 down until it is secured by pins 412/422. Elevator 418 is initially located below the bottom surface of string 304 and then translated upward such that teeth 416 come into contact with string 304. Elevator 418 can include a heater to preheat comb connector 414 in preparation for soldering.

After elevator 418 moves comb connector 414 upward to place teeth 416 in contact with the floor facing side of string 304, pins 412 and heater blocks 410 can lower against the ceiling facing side of string 304. At the same time, lower heater blocks 420 and lower pins 422 can raise upwards from beneath string 304 to secure teeth 416 to the floor facing side of string 304. Accordingly, pins 412 and lower pins 422 can simultaneously secure opposite sides of string 304 during the soldering procedure.

Heater blocks 410 and lower heater blocks 420 can then be controlled to emit hot air at teeth 416 at a predetermined temperature for a predetermined time to reflow solder paste located on teeth 416 to string 304, and accordingly solder comb connector 414 to string 304. Complete metallurgical bonding of teeth 416 to string 304 can be completed without string surface 304 exceeding 210° C. during soldering. After soldering is complete, pins 412 and lower pins 422 can be withdrawn away from teeth 416.

Figure 8:
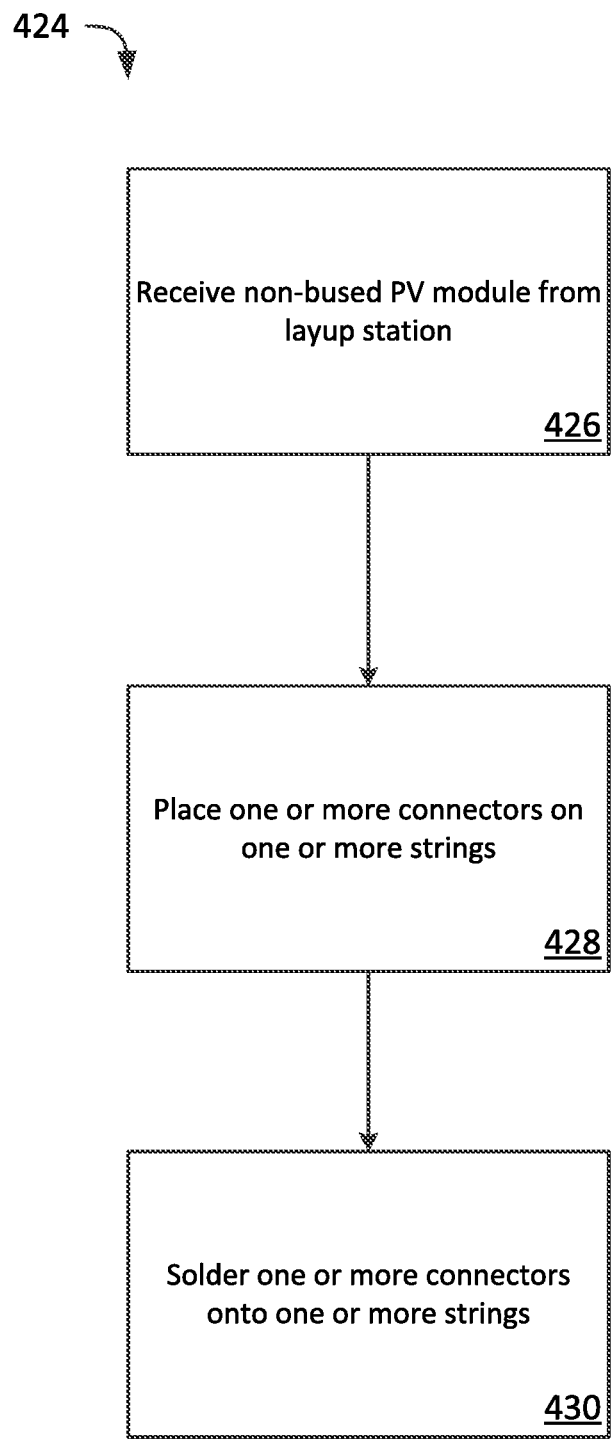
FIG. 8 shows flow chart of a method for soldering connectors to strings, according to some embodiments of the invention.

FIG. 8 illustrates method 422 for performing soldering combs connectors to strings. Method 424 can use aspects, for example, of systems 300 and 400 depicted at FIGS. 6, and 7A-7C. At operation 426, a non-bused PV module having several strings is received from a layup station. The PV module can be received via a computer controlled shuttle system.

At operation 128, one or more connectors, such as connector members 106 of FIG. 3, are picked and then placed on the strings using one or more computer controlled multi-axis robots. The connectors can be inspected for defects after being picked up using a vision system. Acceptable connectors are allowed to be placed on strings for soldering.

At operation 130, computer controlled soldering stations are moved into location for soldering teeth of the connectors to the strings. The soldering stations can be guided by a vision system and include moveable retention pins for securing the teeth to the strings. After the teeth are secured by pins, heather blocks can direct hot air at the teeth to reflow solder paste located on the teeth.

For some locations, the teeth of the connectors are required to be soldered to bottom facing portions of the strings. In such cases, the connectors can be picked and placed onto elevators, which are controlled to lift the teeth of the connectors against the strings. Upper and lower pins can then be actuated to secure the teeth from both sides of the strings, and then upper and lower heater blocks can be controlled to direct hot air at the teeth to cause solder paste on the teeth to reflow and solder to the strings. After the reflow process is complete, the pins can be withdrawn.

Figure 9:
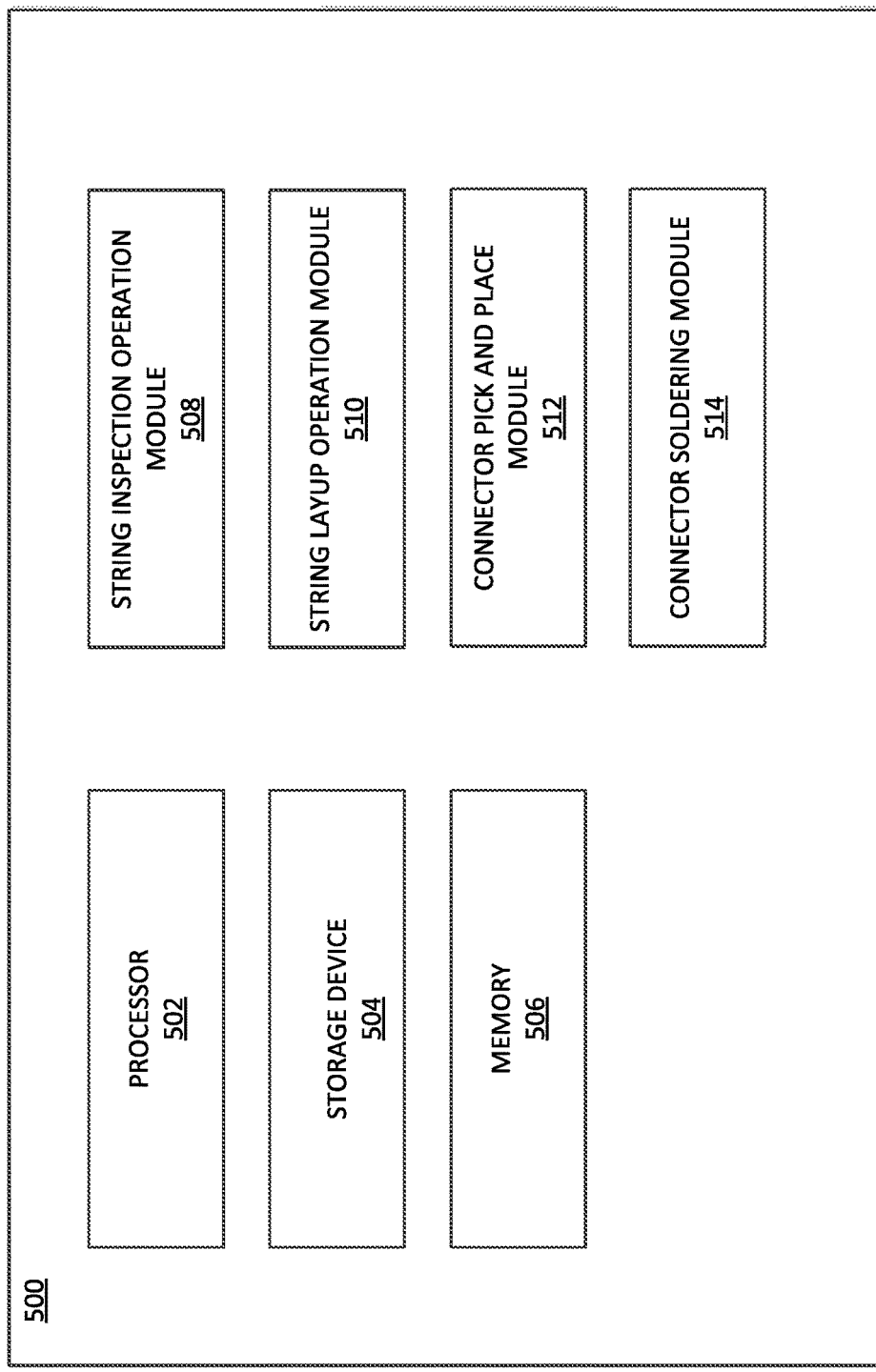
FIG. 9 shows diagram of a control system, according to some embodiments of the invention.

FIG. 9 shows control system 500 that can facilitate assembly of a PV module. Control system 500 can include a plurality of modules which may communicate with one another via a wired or wireless communication channel. Control system 500 may be realized using one or more integrated circuits, and may include fewer or more modules than those shown in FIG. 9. Further, control system 500 may be integrated in a computer system, or realized as a separate device which is capable of communicating with other computer systems and/or devices, such as devices of systems 200, 300, and 400, of FIGS. 4, 6, and 7A-C.

Control system 500 can include processor 502, storage device 504, and memory 506. Memory 506 can include a volatile memory (e.g., RAM) that serves as a managed memory, and can be used to store one or more memory pools. In some embodiments, storage device 506 can store an operating system, and instructions for monitoring and controlling the assembly of a PV substrate, such as the methods or portions of methods depicted at FIGS. 5 and 8, and the methods described above with respect to systems 200, 300, and 400, of FIGS. 4, 6, and 7A-C.

Control system 500 can include string inspection operation module 508, which controls operation of one or more devices associated with inspecting strings, which can be inspection module 204 of FIG. 4 for example. Such devices, for example, can include actuation systems and vision system (e.g., one or more cameras) that can capture images of strings in association with determining defects and obtaining dimensional information of strings. However, other types of sensor systems can be used in conjunction with string inspection operation module 508.

Control system 500 can include string layup operation module 510, which controls operation of one or more devices associated with placing strings at specific locations for assembly into a PV module, which can be multi-axis robot 210 of FIG. 4 for example. Such devices, for example, can include multi-axis actuation systems and vision system (e.g., one or more cameras) that can be used to place strings at specific locations according to prior obtained dimensional information. However, other types of sensor systems can be used in conjunction with string layup operation module 510.

Control system 500 can include connector pick-and-place module 512, which controls operation of one or more devices associated with placing connectors at specific locations for assembly into a PV module, which can be multi-axis robots 310A/B/C of FIG. 6 for example. Such devices, for example, can include multi-axis actuation systems and vision system (e.g., one or more cameras) that can be used to inspect and place connectors at specific locations on strings. However, other types of sensor systems can be used in conjunction with connector pick and place module 512.

Control system 500 can include connector soldering module 514, which controls operation of one or more devices associated with soldering connectors at specific locations for assembly into a PV module, which can be soldering station 400 for example. Such devices, for example, can include multi-axis actuation systems, hot air systems, and vision system (e.g., one or more cameras) that can be used to inspect and place soldering devices at specific locations on strings. However, other types of sensor systems can be used in conjunction with connector soldering module 514.

The system and various devices may also include one or more software applications, modules, services, or other elements located within at least one working memory device, including an operating system and application programs, such as a client application or browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Any of the methods described herein may be totally or partially performed with a computer system including one or more processors, which can be configured to perform the steps. Thus, embodiments can be directed to computer systems configured to perform the steps of any of the methods described herein, potentially with different components performing a respective steps or a respective group of steps. Although presented as numbered steps, steps of methods herein can be performed at a same time or in a different order. Additionally, portions of these steps may be used with portions of other steps from other methods. Also, all or portions of a step may be optional. Additionally, any of the steps of any of the methods can be performed with modules, circuits, or other means for performing these steps.

What is claimed is:

1. A method for soldering a connector to a photovoltaic (PV) module, the method comprising:
   receiving a shuttle holding a PV module comprising a plurality of strings, each of the plurality of strings comprising a plurality of interconnected solar cells extending in a first direction and at least one edge of the respective string comprising a terminal busbar extending in a second direction perpendicular to the first direction, the terminal busbars extending from the shuttle in cantilever such that the terminal busbars are accessible from underneath;
   picking and placing a comb connector onto an elevator, the comb connector comprising a connection bus having a plurality of teeth extending therefrom, wherein the comb connector is placed on the elevator such that the connection bus extends in the second direction and the plurality of teeth of the comb connector extend in cantilever from the elevator;
   raising the elevator to place the teeth of the comb connector in contact with the terminal busbars of the plurality of strings;
   securing the opposite sides of the plurality of strings by pins of a heater assembly; and
   soldering the teeth to the terminal busbars by directing hot air at the teeth and the comb connector.

2. The method of claim 1, wherein picking and placing the comb connector onto the elevator is performed by a multi-axis robot.

3. The method of claim 2, wherein picking and placing the comb connector comprises picking up the comb connector using the multi-axis robot and inspecting the comb connector while the comb connector is being held by the multi-axis robot.

4. The method of claim 1, wherein the elevator heats the comb connector before being raised.

5. The method of claim 1, wherein soldering the teeth comprises moving a first hot air block to be in close proximity to the comb connector and securing the teeth against the terminal busbars using a first plurality of pins.

6. The method of claim 5, wherein soldering the teeth further comprises moving a second hot air block to be in close proximity to the comb connector and securing an opposite side of the terminal busbars using a second plurality of pins, such that the terminal busbars and teeth are secured between the first plurality of pins and second plurality of pins.

7. The method of claim 6, wherein each of the first and second hot air blocks comprise manifolds configured to direct hot air at locations of the terminal busbars and teeth secured between the first plurality of pins and second plurality of pins.

8. A method for assembling a photovoltaic (PV) module, the method comprising:
   scanning a plurality of strings using a vision system to obtain dimensional information for the strings, each of the plurality of strings plurality of interconnected solar cells extending in a first direction and at least one edge of the respective string comprising a terminal busbar extending in a second direction perpendicular to the first direction;
   using a first pick and place robot to layup the plurality of strings on a shuttle based on the dimensional information of the plurality of strings;
   receiving the shuttle holding the plurality of strings placed on the shuttle such that the respective terminal busbars of the plurality of strings extend from the shuttle in cantilever and the respective terminal busbars are accessible from underneath;
   picking and placing a comb connector onto an elevator, the comb connector comprising a connection bus having a plurality of teeth extending therefrom, wherein the comb connector is placed on the elevator such that the plurality of teeth of the comb connector extend in cantilever from the elevator;
   raising the elevator to place the teeth of the comb connector in contact with the terminal busbars of the plurality of strings;
   securing the opposite sides of the plurality of strings by pins of a heater assembly; and
   soldering the teeth to the terminal busbars by directing hot air at the teeth and the comb connector.

9. The method of claim 8, wherein scanning the plurality of strings comprises determining whether unacceptable defects are present within each string of the plurality of string.

10. The method of claim 8, wherein the dimensional information of the strings is used to determine individual alignment of each string of the plurality of strings on the shuttle.

11. The method of claim 8, wherein picking and placing the comb connector onto the elevator is performed by one of a plurality of multi-axis robots.

12. The method of claim 11, wherein the comb connector is a first comb connector of a plurality of comb connectors for soldering to the plurality of strings.

13. The method of claim 12, wherein each of the plurality of comb connectors is inspected after being picked up by one of a plurality of multi-axis robots and before being placed onto the plurality of strings.

14. The method of claim 8, wherein soldering the teeth comprises moving a first hot air block to be in close proximity to the comb connector and securing the teeth against the terminal busbars using a first plurality of pins; and moving a second hot air block to be in close proximity to the comb connector and securing an opposite side of the terminal busbars using a second plurality of pins, such that the terminal busbars and teeth are secured between the first plurality of pins and second plurality of pins.

* * * * *